United States Patent [19]

Strack et al.

[11] Patent Number: 4,543,596
[45] Date of Patent: Sep. 24, 1985

[54] INSULATED-GATE FIELD-EFFECT TRANSISTOR (IGFET) WITH INJECTOR ZONE

[75] Inventors: Helmut Strack; Jenö Tihanyi, both of Munich, Fed. Rep. of Germany

[73] Assignee: Siemens Aktiengesellschaft, Berlin and Munich, Fed. Rep. of Germany

[21] Appl. No.: 510,081

[22] Filed: Jun. 30, 1983

[30] Foreign Application Priority Data

Jul. 1, 1982 [DE] Fed. Rep. of Germany ....... 3224642

[51] Int. Cl.⁴ ..................... H01L 27/02; H01L 29/78
[52] U.S. Cl. ..................................... 357/23.4; 357/43; 357/41; 357/20
[58] Field of Search ............... 357/41, 20, 43, 23 VD, 357/23.4, 38

[56] References Cited

U.S. PATENT DOCUMENTS

| | | | |
|---|---|---|---|
| 4,048,649 | 9/1977 | Bohn | 357/41 |
| 4,344,081 | 8/1982 | Pao et al. | 357/23 VD |
| 4,345,265 | 8/1982 | Blanchard | 357/41 |
| 4,376,286 | 3/1983 | Lidow et al. | 357/41 |
| 4,402,003 | 8/1983 | Blanchard | 357/43 |
| 4,414,560 | 11/1983 | Lidow | 357/41 |
| 4,441,117 | 4/1984 | Zommer | 357/43 |

FOREIGN PATENT DOCUMENTS 140262 11/1980 Japan ..................... 357/41

*Primary Examiner*—Andrew J. James
*Assistant Examiner*—Mark Prenty
*Attorney, Agent, or Firm*—Herbert L. Lerner; Laurence A. Greenberg

[57] ABSTRACT

An IGFET assembly, includes a semiconductor substrate of a given first conductivity type having first and second surfaces, an IGFET having at least one channel zone of a second conductivity type opposite the first given conductivity type embedded in the first surface of the substrate, a source zone of the first conductivity type embedded planar in the channel zone, a drain zone adjacent the first surface of the substrate, a drain electrode connected to the second surface of the substrate, an insulating layer disposed on the first surface of the substrate, at least one gate electrode disposed on the insulating layer, at least one injector zone of the second conductivity type embedded in the first surface of the substrate, a contact for connecting the injector zone to a voltage source, an emitter zone of the first conductivity type embedded in the injector zone, the emitter zone having a heavier doping than the injector zone, the injector zone including a part thereof emerging to the first surface of the substrate, the drain zone having a part thereof emerging to the first surface of the substrate between the channel zone and the injector zone, the parts of the injector and drain zones emerging to the first surface of the substrate being covered by the gate electrode, and the injector zone having a surface and having a doping, at least at the surface thereof, forming a channel in the surface of the injector zone connecting the drain zone to the emitter zone when a voltage is present switching the IGFET into conduction.

6 Claims, 3 Drawing Figures

INSULATED-GATE FIELD-EFFECT TRANSISTOR (IGFET) WITH INJECTOR ZONE

The invention relates to an insulated-gate field-effect transistor (IGFET) with a semiconductor substrate of a first conduction or conductivity type, at least one channel zone of a second conduction type embedded planar in the first surface of the substrate, a source zone of the first conduction type embedded planar in the channel zone, a drain zone adjacent the first surface, a drain electrode connected to the second substrate surface, at least one gate electrode on an insulation layer disposed on the first surface, and at least one injector zone of the second, opposite conduction type embedded in the first surface and being connectible to a voltage through a contact.

Such an IGFET is the subject of U.S. application Ser. No. 340,749, filed Jan. 19, 1982. Power IGFETs of the kind mentioned above which are constructed for high reverse voltages, have a relatively high forward resistance $R_{on}$. The forward resistance is reduced by an injector zone which is embedded in the substrate and can be connected to an external voltage source. With increasing gate voltage, this injector zone increasingly injects charge carriers into the part of the drain zone which forms the current path. This causes a quasi increase of the doping of the drain zone, so that the forward resistance $R_{on}$ is lowered.

It is accordingly an object of the invention to provide an insulated-gate field-effect transistor (IGFET) with an injector zone, which overcomes there hereinaforementioned disadvantages of the heretofore-known devices of this general type, and which further reduces the forward resistance.

With the foregoing and other objects in view there is provided, in accordance with the invention, an IGFET assembly, comprising a semiconductor substrate of a given first conductivity or conduction type having first and second surfaces, an IGFET having at least one channel zone of a second conductivity type opposite the first conductivity type embedded in the first surface of the substrate, a source zone of the first conductivity type embedded in the channel zone, a drain zone adjacent the first surface of the substrate, a drain electrode connected to the second surface of the substrate, an insulating layer disposed on the first surface of the substrate, at least one gate electrode disposed on the insulating layer, at least one injector zone of the second conductivity type embedded in the first surface of the substrate, a contact for connecting the injector zone to a voltage source, an emitter zone of the first conductivity type embedded in the injector zone, the emitter zone having a heavier doping than the injector zone, the injector zone including a part thereof emerging to the first surface of the substrate, the drain zone having a part thereof emerging to the first surface of the substrate between the channel zone and the injector zone, the parts of the injector and drain zones emerging to the first surface of the substrate being covered by the gate electrode, and the injector zone having a surface and having a doping, at least at the surface thereof, forming a channel in the surface of the injector zone connecting the drain zone to the emitter zone when a voltage is present switching the IGFET into conduction.

In accordance with another feature of the invention, the contact for connecting the injector zone to a voltage source is a contact zone of the second conductivity type embedded planar in the first surface.

In accordance with a further feature of the invention, there is provided a jumper or bridge of the second conductivity type embedded in the first surface of the substrate and electrically connected between the injector zone and the contact zone.

In accordance with an added feature of the invention, there is provided an auxiliary FET disposed in the substrate and having a channel zone electrically connected to the contact zone, and a source zone, and another contact connected between the channel and source zones of the auxiliary FET.

In accordance with an additional feature of the invention, there is provided a jumper or bridge of the second conductivity type embedded in the first surface of the substrate and electrically connected between the contact zone of the IGFET and the channel zone of the auxiliary FET.

In accordance with again another feature of the invention, the auxiliary FET includes a gate electrode, and an accumulation layer formed under the gate electrode of the auxiliary FET between the injector zone and the auxiliary FET, and the contact zone of the IGFET is so heavily doped and is disposed between the auxiliary FET and the injector zone so that it completely interrupts the accumulation layer of the auxiliary FET.

In accordance with again a further feature of the invention, the gate electrodes of the IGFET and the auxiliary FET are in the form of a common gate electrode.

In accordance with a concomitant feature of the invention, there is provided at least one other IGFET disposed on the substrate in raster fashion and having contact zones and injector zones, and at least one other auxiliary FET disposed on the substrate in raster fashion, each of the auxiliary FETs being surrounded in lateral direction by a respective contact zone of one of the IGFETs.

Other features which are considered as characteristic for the invention are set forth in the appended claims.

Although the invention is illustrated and described herein as embodied in an insulated-gate field-effect transistor (IGFET) with injector zone, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
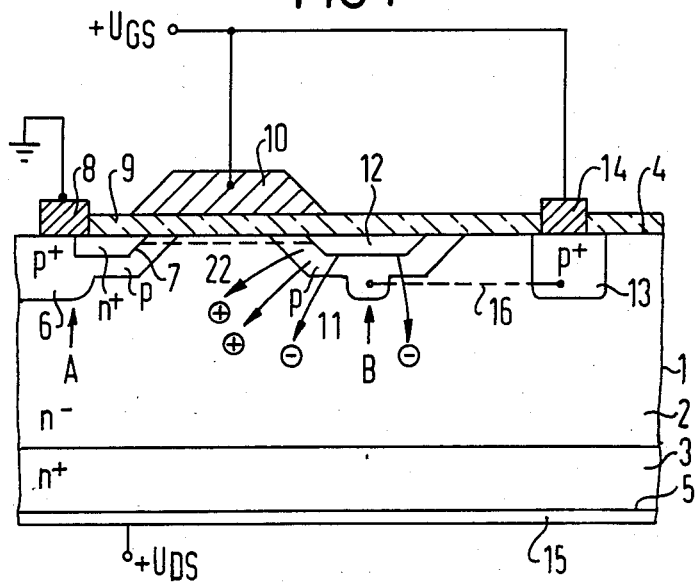
FIG. 1 is a fragmentary, diagrammatic, cross-sectional view of a first embodiment of the invention.

Referring now to the figures of the drawing in detail and first pacrticularly to FIG. 1 thereof, there is seen an IGFET constructed on a substrate 1, which has a comparatively weakly doped zone 2 and a comparatively highly doped zone 3. The zone 2 serves as the drain zone for the IGFET. The substrate 1 is of a first n-conduction or conductivity type and has first and second surfaces 4, 5. A channel zone of an opposite p-conductive type is embedded in a planar fashion in the first surface 4. A relatively highly doped source zone 7 of the first n+ conduction type is embedded planar in the channel zone 6. The source zone 7 and the channel zone 6 together with the drain zone 2 form an IGFET A.

An injector zone 11 of p-conduction type opposite that of the substrate, is disposed in the surface 4 at a lateral distance from the IGFET A. An emitter zone 12 of the first conduction type is embedded planar in the injector zone 11. The emitter zone 12 is preferably highly doped n+. In addition, a relatively highly doped contact zone 13 of the opposite conduction type is embedded in the first surface 4. The contact zone 13 is disposed at a lateral distance from the injector zone 11, but may also be directly contiguous with the zone 11.

The source zone 7 and the channel zone 6 are contacted by a source contact or electrode 8 common to both zones. The surface 4 of the substrate 1 is covered with an insulating layer 9, on which a gate electrode 10 is disposed. On one side, the gate electrode 10 covers a part of the channel zone 6 emerging to the surface 4 and on the other side, the gate electrode 10 covers a part of the injector zone 11 emerging to the surface 4. The contact zone 13 is provided with an electrode 14 which is connected to a gate voltage source $+U_{GS}$ and to the gate electrode 10, or to a separate voltage source. The second surface 5 of the substrate is contacted by an ohmic electrode 15. An electrically conducting connection 16 shown in broken lines, is built in between the injector zone 11 and the contact zone 13. The connection 16 may also be formed, for instance, by one or more bridges or jumpers of the same conduction type as the contact zone 13 and the injector zone 11, which are disposed outside the plane of the drawing.

To explain the operation, it is assumed that the IGFET is connected to a positive drain-source voltage $+U_{DS}$. If a positive gate voltage is applied, an accumulation layer 22 is formed under the gate electrode 10 and an inversion zone is formed on the surface 4 in the channel zone 6. In this way, negative charge carriers flow from the source zone 7 in direction toward the drain electrode 15. If the injector zone 11 is doped weakly enough, at least at the surface 4, i.e. if it is doped as highly as the channel zone 6, an inversion layer also forms at the surface 4 in the injector zone 11. A conducting connection from the source contact 8 to the emitter zone 12 is therefore created. Since the injector zone 11 is placed at positive potential through the connection 16 as well, the contact zones 13 and the contact 14, then the structure formed of the emitter zone 12, the injector zone 11, and the drain zone 2 behaves like a bipolar transistor B, in which the injector zone 11 forms the base zone. Since the transistor B is driven into conduction by a positive control current fed into the injector zone 11, it emits negative charge carriers into the drain zone 2. The injection effect increases steeply with increasing gate voltage because of the current gain of the bipolar transistor B. The edge of the injector zone in addition injects positive charge carriers into the drain zone, which results in a corresponding increase of the concentration of negative charge carriers, i.e., a quasi increase of the doping. Therefore, the forward resistance is lowered.

Figure 2:
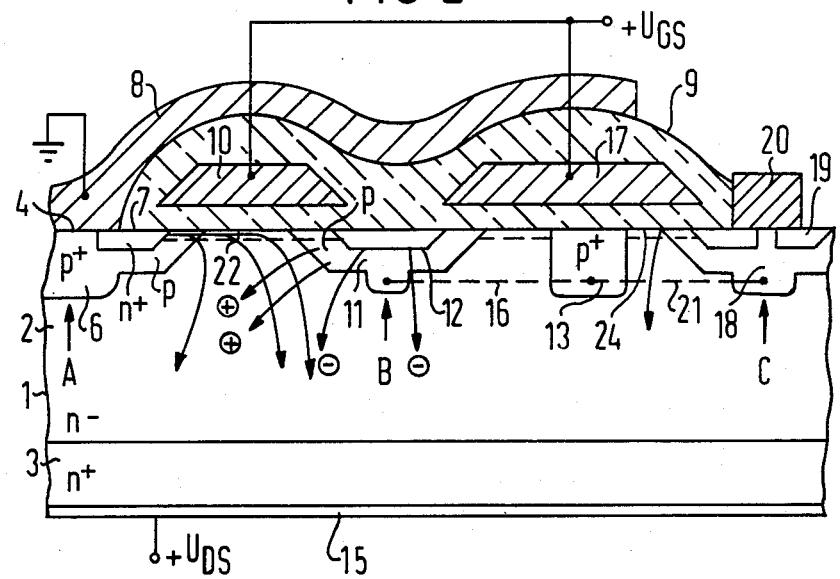
FIG. 2 is a view similar to FIG. 1 of a second embodiment of the invention.

In the device according to FIG. 1, the gate voltage source is loaded with the control current of the bipolar transistor B. For some purposes, this is undesirable. In FIG. 2, a device is shown, in which the control current for the bipolar transistor B is not taken from the gate voltage source but is instead taken from the drain-source voltage source. In FIG. 2, like parts or parts with the same function as in FIG. 1, are provided with the same reference symbols.

In addition to the zones used in the structure according to FIG. 1, an auxiliary FET C which has a channel zone 18 (p-doped) and a source zone 19 (n+-doped), is integrated into the device according to FIG. 2. The source zone 19 and the channel zone 18 are electrically connected to each other by a contact 20. The contact 20 has no further connection, and the potential of the auxiliary FET C therefore drifts between the potential $+U_{DS}$ and ground potential. The auxiliary FET C has a gate elelctrode 17 which is insulated from the surface and covers a part of the channel zone 18 which emerges to the surface. The gate electrode 17 may also cover the contact zone 13 and a part of the injector zone 11 emerging to the surface. However, this is not necessary. This structure is advantageous if the channel zones 6, 18 and the injector zone 11, as well as the source zones 7, 19 and the emitter zone 12, are to be made in the same process step, such as by ion implantation. For this purpose, the gate electrodes 10 and 17 are made of n-doped polycrystalline silicon and form implantation marks for the above-mentioned zones. The gate electrodes 10 and 17 are advantageously electrically connected to each other or form a single gate electrode.

If a positive gate-source voltage is applied, the IGFET A opens and negative charge carriers flow toward the drain electrodes 15. At the same time, the emitter zone 12 is electrically connected to the source contact 8, as described with regard to FIG. 1. As the IGFET A becomes conducting, the auxiliary FET C is simultaneously switched into conduction, forming an accumulation layer 24 and a corresponding inversion layer at the surface 4 in vicinity of the channel zone 18. Negative charge carriers are likewise emitted toward the drain electrode 15. This brings about an ohmic connection between the drain electroce 15 and the source zone 19 of the auxiliary FET C. The channel zone 18 is therefore placed at positive potential through the contact 20. The channel zone 18 is connected to the contact zone 13 through an ohmic connection 21, shown in broken lines. The ohmic connection 21 can be formed, like the ohmic connection 16, by a bridge or jumper of the same conduction type, disposed outside the plane of the drawing. The bipolar transistor B is then also switched into its conducting state through the conducting connection 16, and emits negative charge carriers, as described in connection with FIG. 1. The edge of the injector zone 11 simultaneously injects positive charge carriers into the current path. The forward resistance $R_{on}$ of the IGFET is therefore lowered considerably.

The contact zone 13 is basically not necessary for the ohmic connection between the channel zone 18 and the injector zone 11. However, the contact zone 13 serves to electrically decouple the auxiliary FET C from the IGFET A, since without the contact zone 13, a continuous inversion layer could develop at the surface 4. The auxiliary FET C and the IGFET A would therefore be electrically connected in parallel. To electrically separate the accumulation layers 22 and 24, the contact zone 13 is disposed between the bipolar transistor B and the auxiliary FET C. The contact zone 13 must be doped so heavily that no inversion takes place at its surface under the gate electrode 17. The doping at the surface of the contact zone 13 may, for instance, be adjusted to $10^{18}$ to $10^{20}$ atoms per $cm^{-3}$. The channel zone and the injector zone at the surface of the substrate, on the other hand, have a doping of $10^{16}$ to $10^{17}$ atoms per $cm^{-3}$, for instance.

Figure 3:
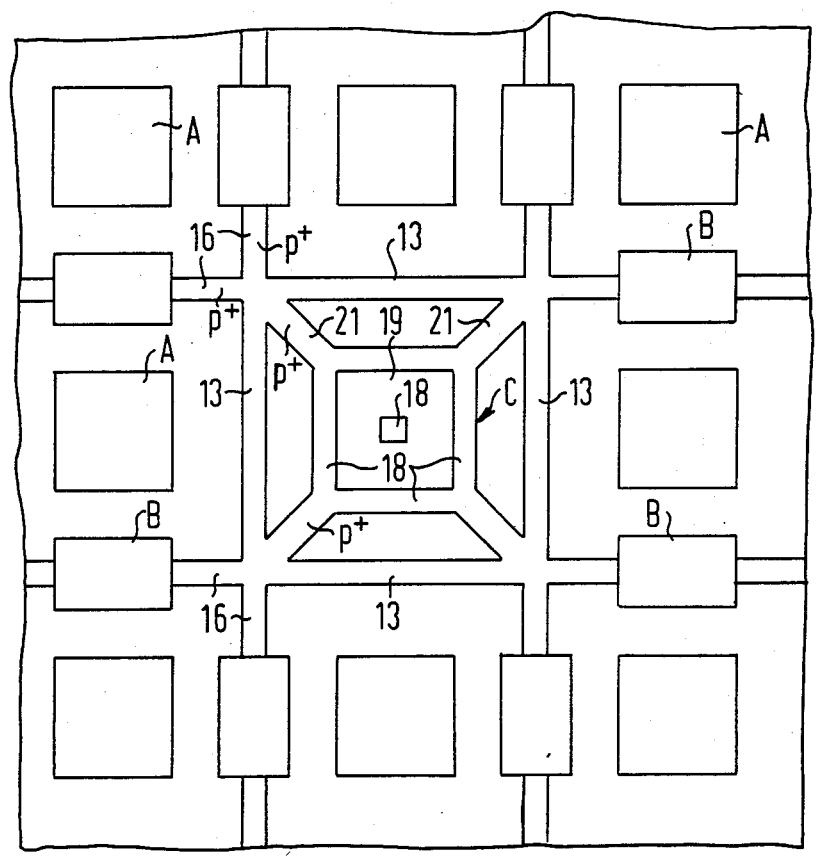
FIG. 3 is a top plan view of an integrated semiconductor device according to the embodiment of FIG. 2, with a multiplicity of IGFETs and injector zones disposed in raster fashion.

For larger currents, it is advisable to build up an integrated structure with a multiplicity of the elements shown in FIG. 2. Such a structure is shown in FIG. 3. The integrated structure is formed of several IGFETs A disposed in raster fashion, several bipolar transistors B, and, for instance, one auxiliary FET C. For electrically separating the auxiliary FET C from the IGFET cells A, the contact zone 13 surrounds the auxiliary FET C leaving a lateral spacing on all sides. The electric connections 16 and 21 shown in broken lines in FIG. 2, are shown in FIG. 3 as bridges which are embedded in the surface and have a conduction type opposite that of the substrate. For even higher powers, it is possible to construct the structure shown in FIG. 3 as a multiple again, in raster fashion on a larger substrate.

The foregoing is a description corresponding in substance to German Application No. P 32 24 642.0, dated July 1, 1982, the International priority of which is being claimed for the instant application, and which is hereby made part of this application. Any material discrepancies between the foregoing specification and the aforementioned corresponding German application are to be resolved in favor of the latter.

We claim:

1. IGFET assembly, comprising a semiconductor substrate of a given first conductivity type having first and second surfaces, an IGFET having at least one channel zone of a second conductivity type opposite said first given conductivity type embedded in said first surface of said substrate, a source zone of said first conductivity type embedded planar in said channel zone, a drain zone adjacent said first surface of said substrate, a drain electrode connected to said second surface of said substrate, an insulating layer disposed on said first surface of said substrate, at least one gate electrode disposed on said insulating layer, a bipolar transistor having at least one base zone of said second conductivity type embedded in said first surface of said substrate, and an emitter zone of said first conductivity type embedded in said base zone, said emitter zone having a heavier doping than said base zone, said base zone including first parts and second parts thereof emerging to said first surface of said substrate, said drain zone having parts thereof emerging to said first surface of said substrate, and first parts of said base zone and said parts of said drain zone emerging to said first surface of said substrate being covered by said gate electrode, an auxiliary FET disposed in said substrate and having a source zone, a channel zone and a drain zone, said drain zone and said channel zone having parts thereof emerging to said first surface of said substrate, said channel zone of said auxiliary FET being electrically connected to said base zone, a floating contact contacting said source zone and said channel zone of said auxiliary FET, a further gate electrode disposed on said insulating layer and covering said second parts of said base zone and said part of said channel zone of said auxiliary FET emerging to said first surface of said substrate, and base zone having a surface and having a doping, at least at said surface thereof, forming channels in said surface of said base zone connecting said drain zones of said IGFET and of said auxiliary FET to said emitter zone when a voltage is present switching said IGFET into conduction.

2. IGFET assembly according to claim 1, wherein said gate electrodes of said IGFET and said auxiliary FET are in the form of a common gate electrode, and including a further zone of said second conductivity type embedded in said first surface of said substrate between said base zone and said auxiliary FET and being electrically connected to said base zone and to said channel zone of said auxiliary FET.

3. IGFET assembly according to claim 2, including a jumper of said second conductivity type embedded in said first surface of said substrate and electrically connected between said base zone and said further zone.

4. IGFET assembly according to claim 2, including a jumper of said second conductivity type embedded in said first surface of said substrate and electrically connected between said further zone and said channel zone of said auxiliary FET.

5. IGFET assembly according to claim 2, wherein said auxiliary FET includes a gate electrode, the accumulation layers being formed under said gate electrode of said auxiliary FET and said further zone, said further zone being heavily doped and completely interrupting said accumulation layers.

6. IGFET assembly according to claim 1, wherein at least the surface of said base zone is as highly doped as said channel zone.

* * * * *